US 6,726,801 B2

(12) United States Patent
Ahn (10) Patent No.: US 6,726,801 B2
(45) Date of Patent: Apr. 27, 2004

(54) DRY ETCHING APPARATUS FOR MANUFACTURING SEMICONDUCTOR DEVICES (75) Inventor: Jae-Su Ahn, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 127 days.

(21) Appl. No.: 10/184,452

(22) Filed: Jun. 28, 2002

(65) Prior Publication Data
US 2003/0019579 A1 Jan. 30, 2003

(30) Foreign Application Priority Data
Jul. 24, 2001 (KR) .................... 2001-0044577

(51) Int. Cl.⁷ .......................... H01L 21/306; C23F 1/00
(52) U.S. Cl. ................................................. 156/345.29
(58) Field of Search ..................... 156/345.29

(56) References Cited

U.S. PATENT DOCUMENTS

| 5,837,093 A | * | 11/1998 | Hasegawa et al. ...... 156/345.33 |
| 5,919,332 A | * | 7/1999 | Koshiishi et al. ....... 156/345.47 |
| 6,000,360 A | * | 12/1999 | Koshimizu .............. 188/723 E |
| 6,129,808 A | * | 10/2000 | Wicker et al. ............ 156/345.1 |
| 6,176,969 B1 | * | 1/2001 | Park et al. .................. 156/345 |
| 6,402,848 B1 | * | 6/2002 | Horiguchi et al. .......... 118/715 |
| 6,471,782 B1 | * | 10/2002 | Fang et al. ................. 118/726 |
| 6,527,911 B1 | * | 3/2003 | Yen et al. ............... 156/345.43 |
| 6,544,380 B2 | * | 4/2003 | Tomoyasu et al. ...... 156/345.51 |
| 6,576,860 B2 | * | 6/2003 | Koshimizu et al. ..... 219/121.43 |
| 2003/0019579 A1 | * | 1/2003 | Ahn ....................... 156/345.29 |

FOREIGN PATENT DOCUMENTS

| JP | 2000-58518 | * | 2/2000 | ....... H01L/21/3065 |
| JP | 00-286242 | | 10/2000 | ....... H01L/21/3065 |
| KR | 10-197649 | * | 2/1999 | ........... H01L/21/20 |
| KR | 2000-26347 | * | 5/2000 | ......... H01L/21/306 |

* cited by examiner

Primary Examiner—Jeffrie R. Lund
(74) Attorney, Agent, or Firm—Mills & Onello, LLP (57) ABSTRACT

Disclosed is a dry etching apparatus for etching a film coated on a semiconductor substrate. An electrostatic chuck on which the semiconductor substrate is disposed is provided in a chamber carrying out an etching process. The electrostatic chuck is elevated to perform the etching process and moved downwardly to load and unload the semiconductor substrate. When the chuck is elevated, a peripheral surface of the chuck faces an inner edge of a baffle plate mounted on the inner surface of the chamber. A reaction byproduct created for the etching process and a non-reacted gas are discharged through slits formed in the baffle plate from the chamber. Accordingly, as the baffle plate is not moved along with the chuck, the reaction byproduct attached to the baffle plate cannot be exfoliated.

13 Claims, 9 Drawing Sheets

DRY ETCHING APPARATUS FOR MANUFACTURING SEMICONDUCTOR DEVICES

BACKGROUND OF THE INVENTION

1. Field of the Invention

The present invention relates to an etching apparatus for manufacturing semiconductor devices, and more particularly to a dry etching apparatus using plasma.

2. Description of the Related Art

In recent years, semiconductor devices have been substantially developed as information media such as computers are rapidly popularized. Accordingly, semiconductor devices are required to operate at a high speed and to have a large storage capacitance.

In order to satisfy these requirements, semiconductor device fabrication technologies have been developed in the trend of improving degree of integration, reliability and response speed. Accordingly, requirements for fine process technologies such as etching for forming patterns, which is an important technology to improve the degree of integration of the semiconductor devices, tend to be very strict.

Etching is a technology of forming the patterns by removing a selected portion of the film on the semiconductor substrate. Recently, a dry etching apparatus using plasma is mainly used in the process of fabricating the semiconductor devices in which a width of circuit lines is 0.15 μm or less.

The dry etching apparatus includes a chamber for performing a process for etching the film, a chuck on which the semiconductor substrate is placed, and a baffle plate which is mounted to enclose the periphery of the chuck and has a plurality of slits for discharging reaction byproducts created in etching a film and non-reacted gas.

The baffle plate and the chuck divide the chamber into a process region in which the etching process is performed and a vacuum region for making a vacuum in the process region. Further, the baffle plate maintains the uniform density of the plasma supplied to the process region to etch the film on the semiconductor substrate.

U.S. Pat. No. 6,176,969 issued to Park, et al. discloses a dry etching apparatus including a baffle plate capable of easily discharging a reaction byproduct and non-reacted gas. Korea Laid-open Patent Publication No. 2000-026347 discloses a dry etching apparatus having an insulating ring made of a ceramic material for protecting screws for use in fixing a baffle plate to a chamber. The ceramic material has an excellent resistance against a cleaning process.

Korean Patent No. 197,649 discloses a thin film deposition apparatus including a baffle plate fixed to a chamber for preventing expansion of plasma under low pressure.

Japanese Laid-open Patent Publication No. 2000-058518 discloses a plasma treating apparatus including a baffle plate in which an exhaust port is formed and a chuck on which a semiconductor substrate is placed.

A dry etching process performed by the dry etching apparatus will be described below.

An electrostatic chuck is provided in the chamber performing the dry etching process. The semiconductor substrate is placed on the chuck. A baffle plate having a plurality of slits is mounted along a peripheral surface of the electrostatic chuck. The electrostatic chuck and the baffle plate are upwardly and downwardly moved in the chamber. An upper electrode and a lower electrode are respectively mounted on an upper portion of the chamber and the electrostatic chuck in order to generate the plasma.

When the semiconductor substrate is carried in the chamber, the electrostatic chuck and the baffle plate are lowered to a position at which the semiconductor substrate is transported. After the semiconductor substrate is loaded on the electrostatic chuck, the electrostatic chuck and the baffle plate are elevated to a position at which the dry etching process is carried out.

In the dry etching process, an outer edge of the baffle plate faces an inner surface of the chamber. Accordingly, the process region in which the dry etching process is performed is defined by the inner surface of the chamber, the upper electrode, the baffle plate and the electrostatic chuck.

The upper electrode is connected to an etching gas supply part that supplies an etching gas in the dry etching process. When radio frequency electric power is applied to the upper electrode and the lower electrode, the etching gas supplied to the process region of the chamber is converted into a plasma phase.

A film coated on the semiconductor substrate is etched by the reaction between the plasma and the film. A reaction byproduct generated by the chemical reaction of the plasma with the film and a non-reacted gas are discharged through the slits formed in the baffle plate.

However, the reaction byproducts are not completely discharged from the process region and the remaining byproducts are attached to the inner surface of the chamber, the electrostatic chuck and the baffle plate which define the process region.

The reaction byproducts attached to the upper surface of the baffle plate and inner surfaces of the slits are exfoliated from the baffle plate by the changes in the pressure and air stream in the chamber when the baffle plate is moved upwardly and downwardly, and are dispersed in the chamber.

Furthermore, the reaction byproducts attached to the inner surface of the chamber are exfoliated from the outer edge of the baffle plate while the baffle plate is moved upwards and downwards and then dispersed in the chamber.

The exfoliated and dispersed reaction byproducts are fine particles, which act as a pollution material that is attached to and contaminates the semiconductor substrate during the process.

Accordingly, there are problems that the reliability and productivity of the semiconductor device is lowered and the working time of the etching apparatus is reduced due to a non-periodic maintenance and a repair step to remove the pollution material.

SUMMARY OF THE INVENTION

The present invention has been made to solve the aforementioned problem, and accordingly it is an object of the present invention to provide a dry etching apparatus that reduces the amount of pollution material created by the exfoliating of reaction byproducts that adhere to a chamber used for performing a dry etching process.

In accordance with the invention, there is provided a dry etching apparatus having a chamber into which a plasma gas for etching a film coated on a semiconductor substrate is provided in a plasma phase. In the chamber, a dry etching process is performed by using the plasma. A chucking apparatus for supporting the semiconductor substrate is disposed in the chamber, and is upwardly elevated to a predetermined position to perform the dry etching process and moved downwardly to load and unload the semiconductor substrate. A baffle plate discharges reaction byproducts created in the dry etching process and a non-reacted gas out of the chamber. The baffle plate has a flat ring shape and slits through which the reaction byproduct and the non-reacted gas are exhausted, and is fixed to an inner surface of the chamber so that a terminal end of the baffle plate faces a peripheral surface of the chucking apparatus at a predetermined position.

An one embodiment, a step portion on which the baffle plate is placed is formed along an inner surface of the chamber.

The dry etching apparatus may further include at least one pad for adjusting a mounting height of the baffle plate, the pad being disposed between the step portion of the chamber and the baffle plate. The pad can have a flat-ring shape and a thickness of 0.9 mm~1.1 mm. The pad is made of aluminum and the surface of the pad is subjected to an anodizing treatment to form a coating layer.

The dry etching apparatus preferably comprises a shield for protecting the inner surface of the chamber against the plasma for use in the dry etching process. The shield is disposed on the baffle plate to cover the inner surface of the chamber. The shield is made of aluminum, of which an inner surface is coated with a material subjected to an anodizing treatment.

A plurality of thru-holes are formed along an outer edge of the baffle plate and a plurality of screw-holes corresponding to the thru-holes of the baffle plate are formed on the step portion on which the baffle plate is placed so that screws fix the baffle plate to the chamber through the thru-holes of the baffle plate.

In another embodiment, both the pad and the shield have a plurality of thru-holes corresponding to the thru-holes of the baffle plate so as to be attached to the chamber by screws.

In the dry etching apparatus, since the baffle plate is mounted on the inner surface of the chamber so that the baffle plate does not to move upwards and downwards along with the chuck, the reaction byproduct adhered to the baffle plate is prevented from being exfoliated from the baffle plate. Accordingly, an amount of a pollution material caused by exfoliating of the reaction byproduct can be reduced.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
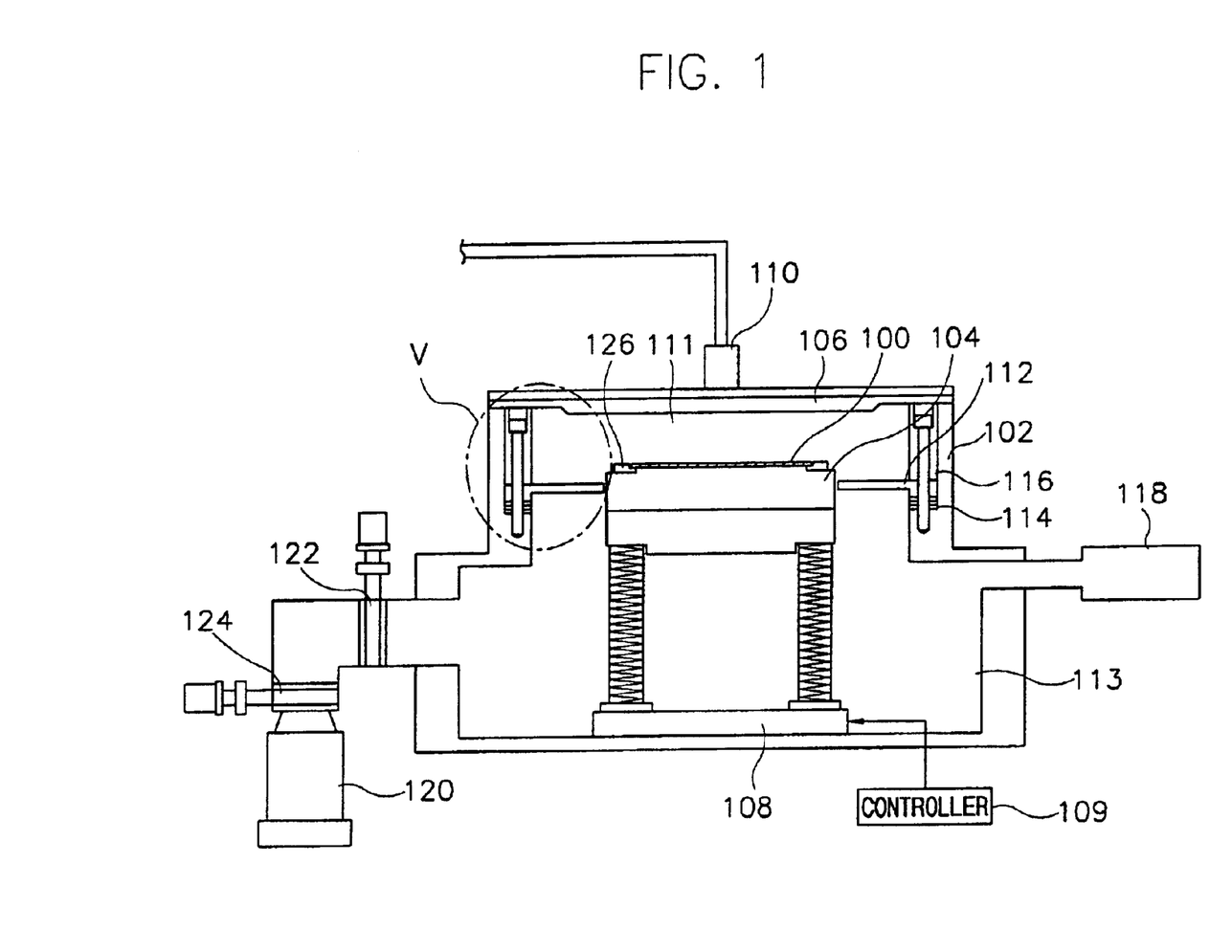
FIG. 1 is a schematic view illustrating a dry etching apparatus according to an embodiment of the present invention.

FIG. 1 is a schematic sectional view illustrating a dry etching apparatus according to an embodiment of the present invention. Referring to FIG. 1, the apparatus includes a chamber 102 in which a dry etching process is performed to etch a film formed on a semiconductor substrate 100. An electrostatic chuck 104, an upper electrode 106 and a lower electrode are disposed in the chamber 102. The semiconductor substrate 100 is placed on the electrostatic chuck 104. Radio frequency electric power is applied to the upper electrode 106 and the lower electrode to generate plasma.

When the radio frequency electric power is applied to the lower electrode to generate the plasma, the upper electrode 106 acts as a ground. The upper electrode 106 is disposed at an upper portion of the chamber 102 and the lower electrode is disposed in the electrostatic chuck 104.

A driving section 108 is connected to a lower portion of the electrostatic chuck 104 to move the electrostatic chuck 104 upwardly and downwardly. A control section 109 is connected to the driving section 108 to control the driving section 108 as the dry etching process is performed. An etching gas supplying part 110 is connected to the upper electrode 106 to supply an etching gas needed for the dry etching process to the chamber 102.

A baffle plate 112 having a flat ring shape is mounted on an inner surface of the chamber 102. An inner space of the chamber 102 is divided into two regions. The regions include a process region 111 over the baffle plate 112 in which the dry etching process is performed and a vacuum region 113 below the baffle plate 112 for vaccumizing the process region 111.

The baffle plate 112 is mounted in the chamber 102 such that an inner edge thereof faces an outer peripheral surface of the electrostatic chuck 104 at a predetermined position. The driving section 108 moves the chuck 104 to a height of the baffle plate (to the above predetermined position) for performing the dry etching process.

A step portion is formed on the inner surface of the chamber 102 in order to mount the baffle plate 112 in the chamber 102. A plurality of pads 114 are disposed on the step portion to adjust a mounting height of the baffle plate 112.

A shield 116 is disposed on the baffle plate 112 to protect the inner surface of the chamber 102 against the plasma from the process region 111.

Therefore, when the electrostatic chuck 104 is elevated to perform the dry etching process, the process region 111 is defined by the upper electrode 106, the shield 116 mounted in the chamber 102, the baffle plate 112 and the electrostatic chuck 104.

A transporting section 118 for transporting the semiconductor substrate 100 is connected to a side of the chamber 102 defining the vacuum region 113, and a pump 120 for vacuumizing the process region 111 is connected to the other side of the chamber 102.

A vacuum control valve 122 and a gate valve 124 are installed in a vacuum pipe extending between the chamber 102 and the pump 120. The gate valve 124 is opened and closed by operation of the pump 120, and the vacuum control valve 122 is controlled to regularly maintain the desired degree of vacuum in the process region.

When the semiconductor substrate 100 is loaded on the electrostatic chuck 104 from the transporting section 118 or unloaded from the electrostatic chuck 104 after finishing the dry etching process, the electrostatic chuck 104 is moved down to a position of the transporting section 118.

If the radio frequency electric power is applied to the lower electrode after the etching gas is supplied from the process region 111 to the etching gas supply 110, the etching gas is converted into the plasma phase. The plasma gas chemically reacts with the film formed on the semiconductor substrate 100, thereby etching the film. Reaction byproducts generated from etching the film and a non-reaction gas are discharged through slits in the baffle plate 112 from the process region to the vacuum region by the operation of the pump 120.

A focus ring 126 is disposed on an upper surface of the electrostatic chuck 104 to enclose the semiconductor substrate 100. The focus ring 126 supports an edge of the semiconductor substrate 100 to make uniform the plasma density. Thus, the film formed on the semiconductor substrate 100 is uniformly etched.

Figure 2:
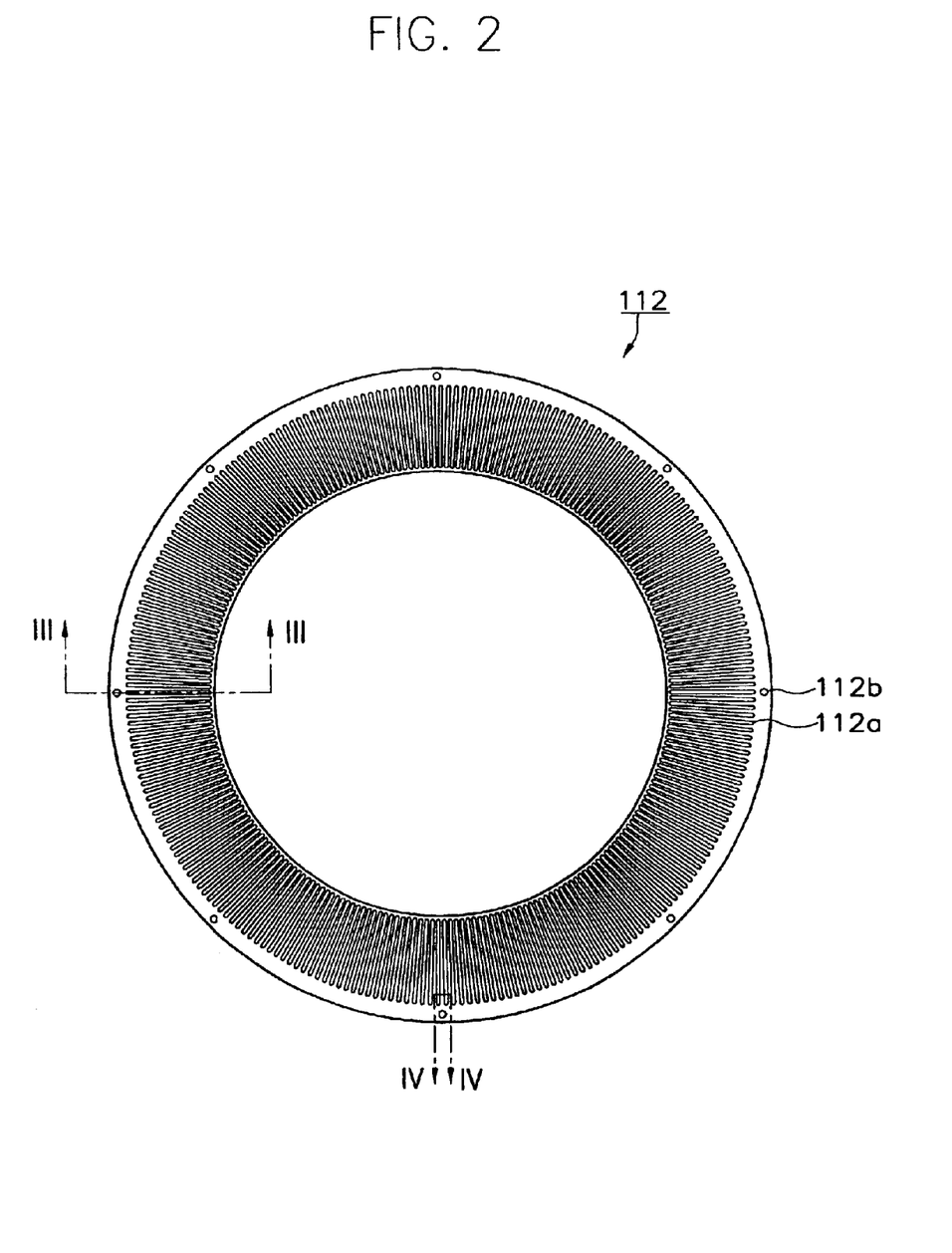
FIG. 2 is a plan view showing a baffle plate for use in the dry etching apparatus in FIG. 1.

FIG. 2 is a plan view showing the baffle plate in FIG. 1. Referring to FIG. 2, a plurality of slits 112a are formed in a radial manner in the baffle plate 112 in order to discharge the etching gas, the reaction byproducts generated by the chemical reaction of the film formed on the semiconductor substrate 100 with the plasma gas, and the non-reacted gas during the dry etching process.

The baffle plate 112 is made of aluminum. Both surfaces of the baffle plate 112 are subjected to an anodizing treatment in order to prevent damage of the baffle plate 112 by the plasma generated in the chamber during the etching process. In one embodiment, the baffle plate 112 has an outer diameter of about 365~366 mm and an inner diameter of about 250~251 mm. According to one embodiment of the present invention, the outer diameter of the baffle plate preferably is 365.5 mm and the inner diameter preferably is 250.6 mm.

The inner diameter of the baffle plate 112 can be varied so as to correspond to the diameter of the electrostatic chuck (see FIG. 1). However, the baffle plate 112 must have the inner diameter enough to maintain a suitable pressure in the process region in which the dry etching process is performed and a suitable density of the plasma while allowing the electrostatic chuck to move smoothly. In one embodiment of the present invention, therefore, the baffle plate 112 is designed in order that a gap between the outer peripheral surface of the electrostatic chuck 104 and the inner edge of the baffle plate 112 is about 0.5~0.8 mm.

A plurality of thru-holes 112b is formed in the baffle plate 112 along the outer edge of the baffle plate 112 in order to mount the baffle plate 112 on the inner surface of the chamber 102 in which the dry etching process is carried out.

Figure 3:
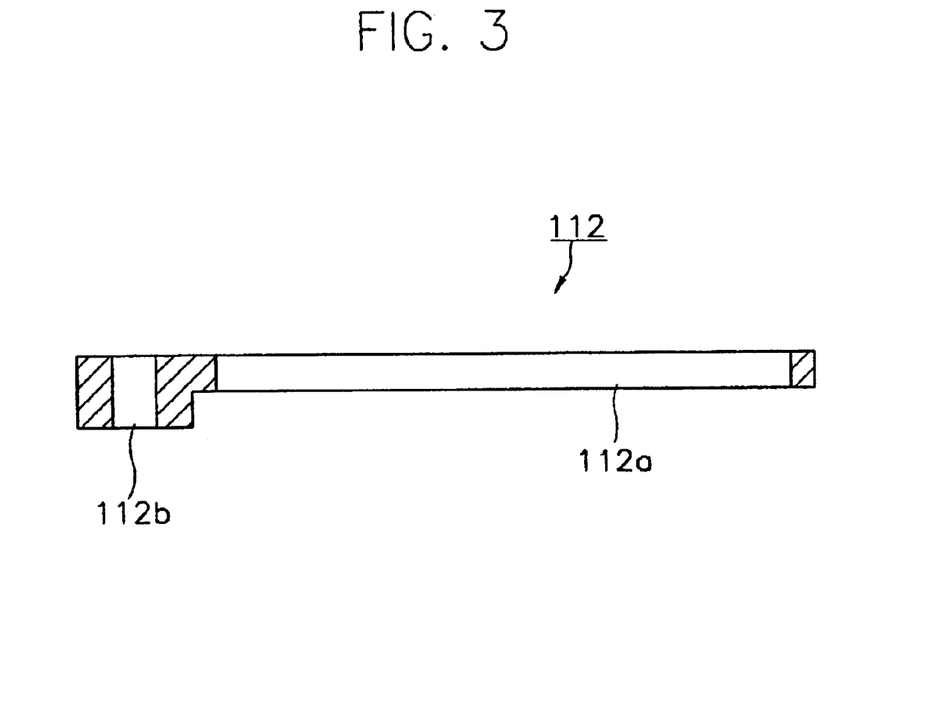
FIG. 3 is a sectional view of the baffle plate, taken along a line III—III in FIG. 2.

FIG. 3 is a sectional view of the baffle plate 112, taken along the line III—III in FIG. 2. Referring to FIG. 3, the outer edge of the baffle plate 112 at which the plurality of the thru-holes is formed is thicker than the inner edge of the baffle plate 112 in which the slits 112a are formed and is projected in a downward direction.

According to one embodiment of the present invention, the eight thru-holes 112b are formed in the baffle plate 112 along the outer edge of which a thickness is 6 mm. The inner edge of the baffle plate 112 in which the slits 112a are formed has a thickness of 3 mm. The diameter of the thru-holes 112b is about 2.5~3 mm.

Figure 4:
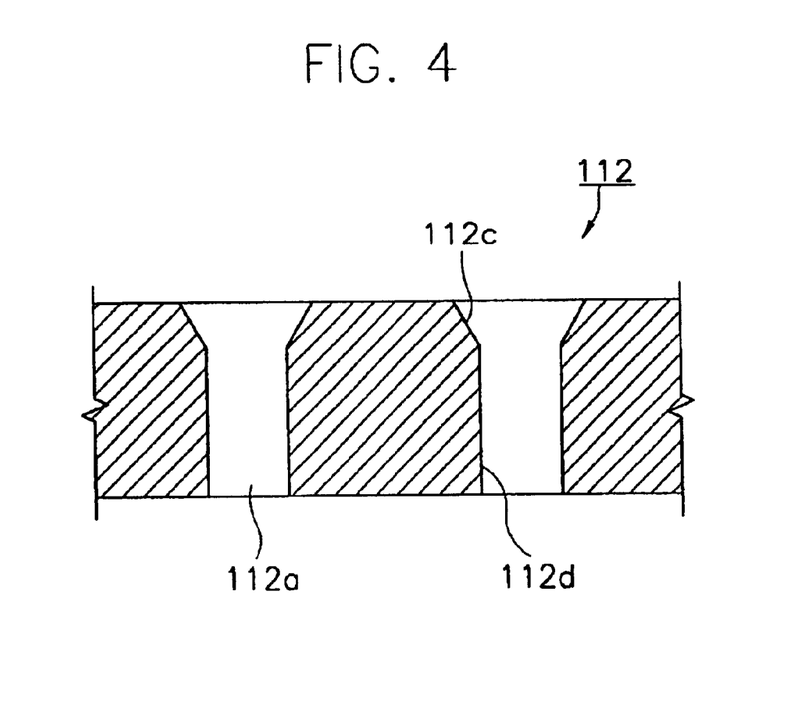
FIG. 4 is a sectional view of the baffle plate, taken along a line IV—IV in FIG. 2.

FIG. 4 is a sectional view of the baffle plate 112, taken along the ling IV—IV in FIG. 2. Referring to FIG. 4, the slits 112a formed in the baffle plate 112 have a first tapered inner surface 112c extending to a predetermined depth from the upper surface of the baffle plate 112 and a second inner surface 112d extending from an end of the first inner surface 112d to the lower surface of the baffle plate 112. The slits are spaced apart by a predetermined distance from one another. The slits 112a are formed at a predetermined distance in the baffle plate 112 in a circumference direction.

In one embodiment, a width of a slit is about 1.7~1.9 mm at an upper portion of the slits and about 1.0~1.2 mm at a lower portion of the slits in the baffle plate 112. The first inner surface 112c of the slits 112a has preferably an incline angle of about 45~60 degrees.

According to one embodiment of the present invention, the width of a slit is preferably 1.8 mm at the upper portion of the slits and 1.1 mm at the lower portion of the slits in the baffle plate 112. The first inner surface 112c of the slits 112a more preferably has the incline angle of 55 degrees.

In one embodiment of the present invention, even though the baffle plate 112 is made in the above described dimensions to discharge the reaction byproduct generated in the dry etching process and the non-reacted gas from the chamber 102, it is understood that the present invention should not be limited to these preferred embodiments but various changes and modifications can be made according to different conditions of the etching process.

Figure 5:
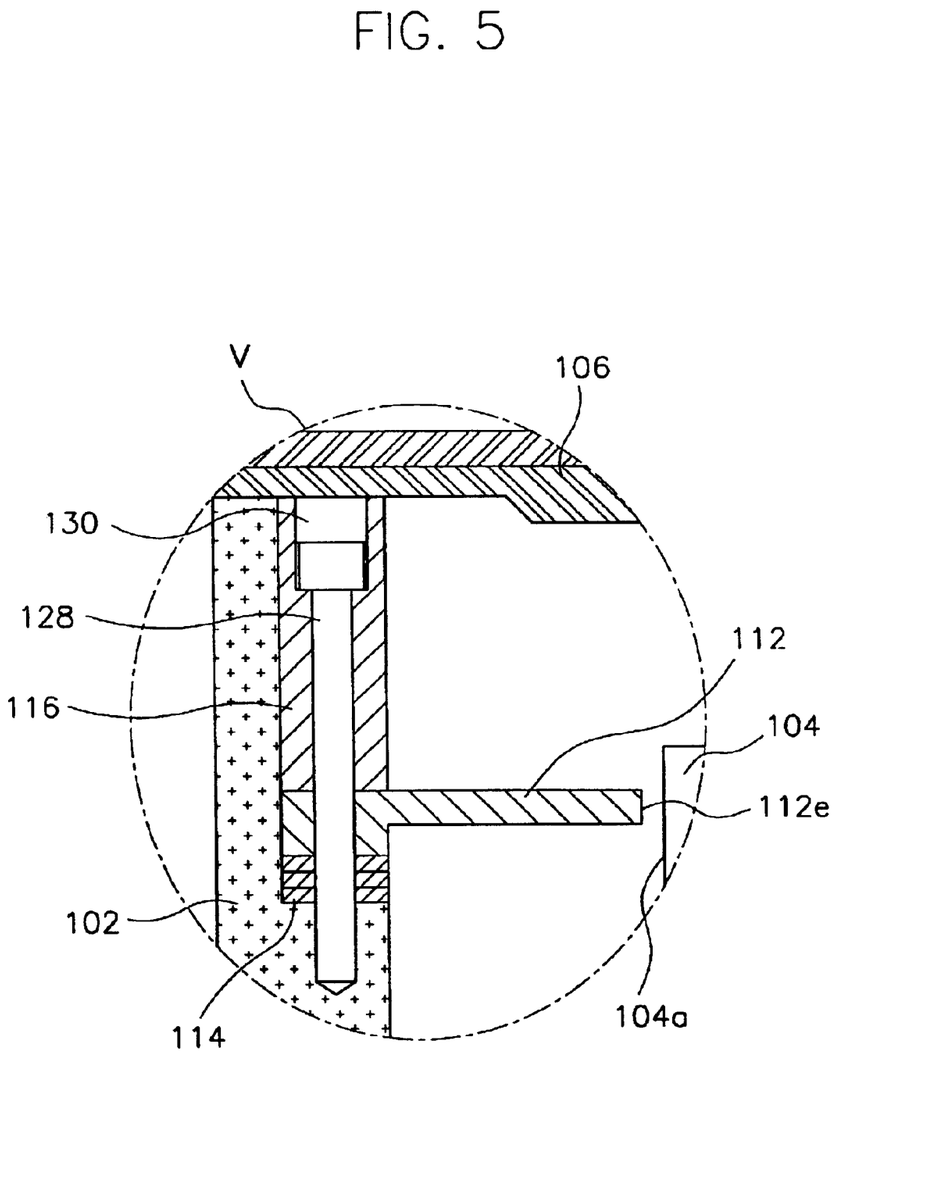
FIG. 5 is a partially enlarged sectional view of the dry etching apparatus, marked in a circle V in FIG. 1.
Figure 6:
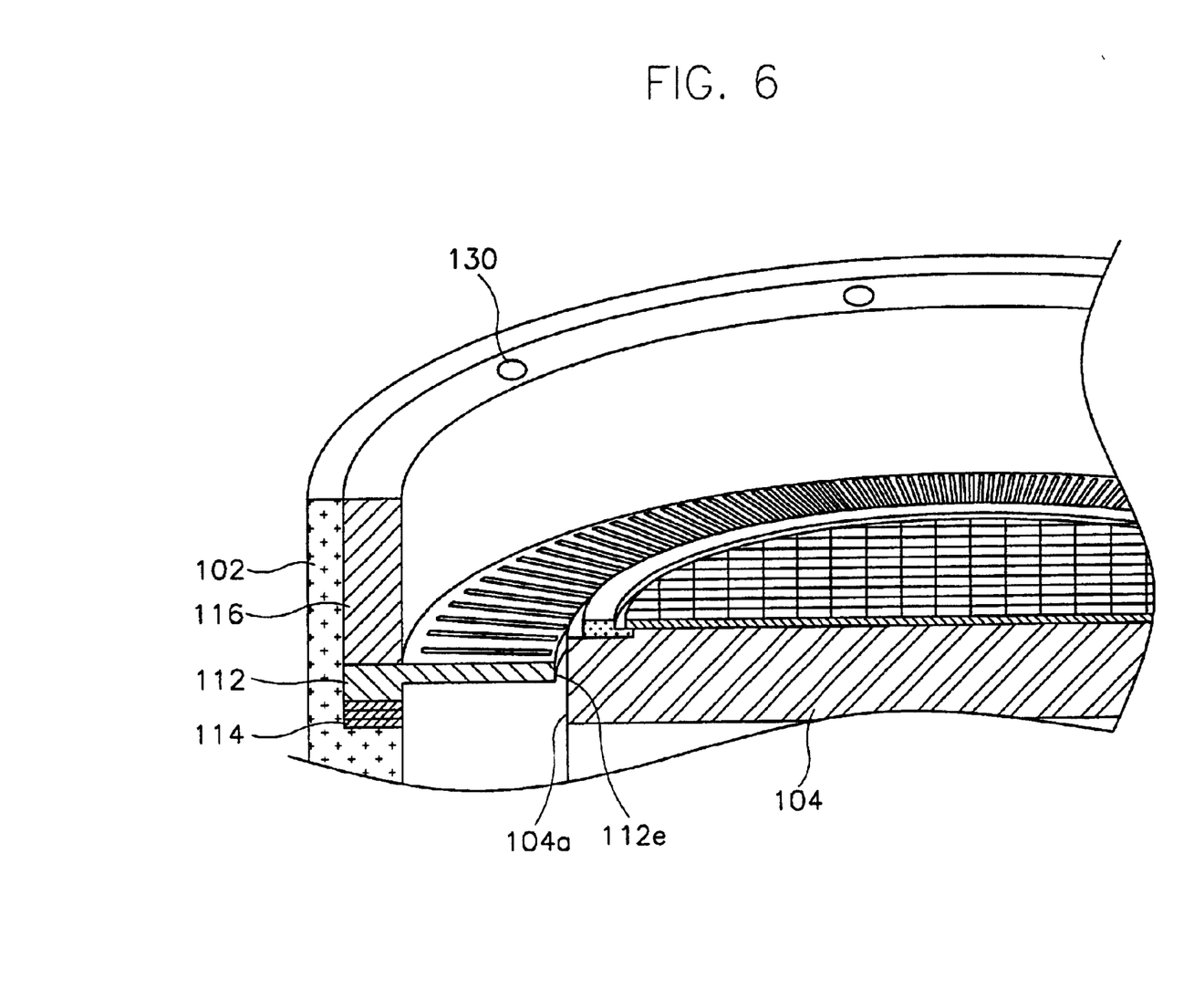
FIG. 6 is a perspective sectional view showing the dry etching apparatus, in which the baffle plate, a shield and pads are depicted.
Figure 7:
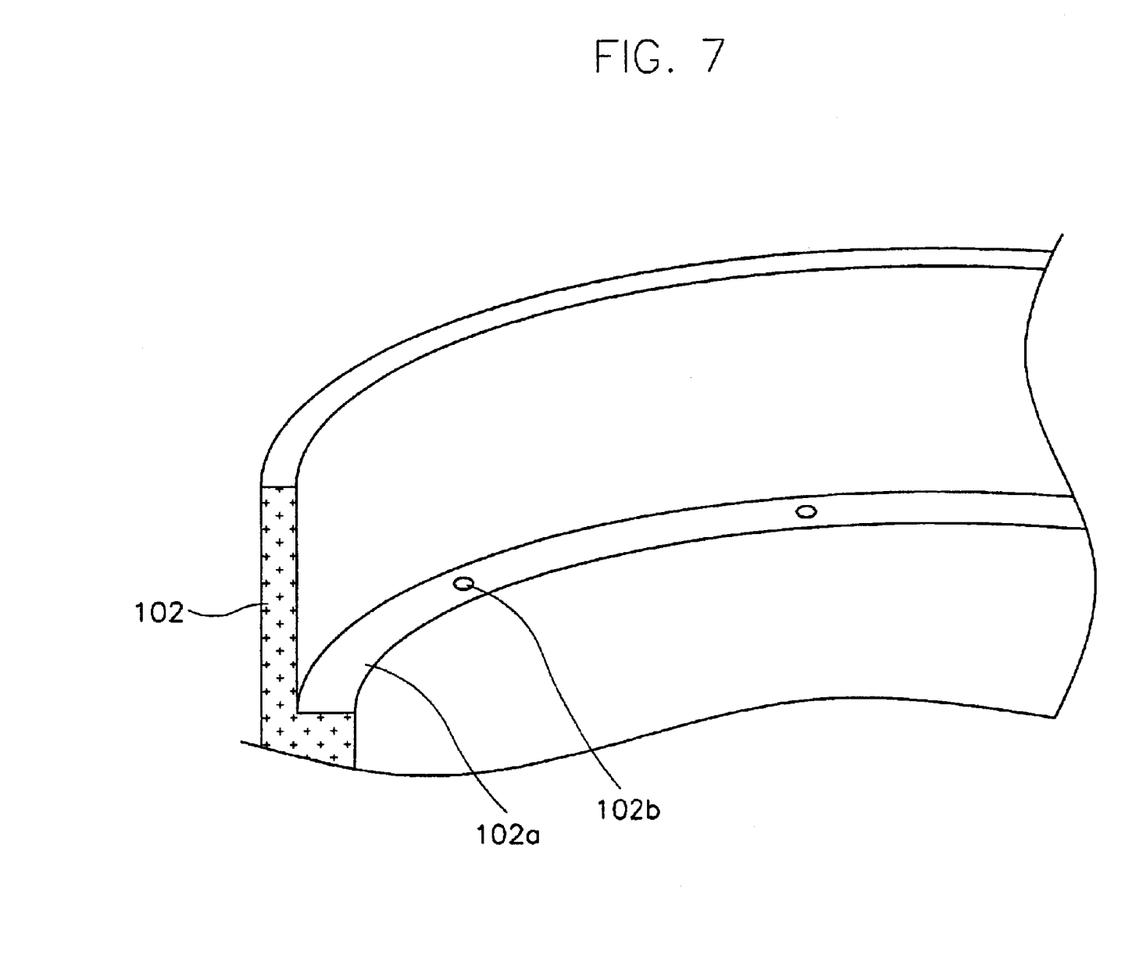
FIG. 7 is a perspective sectional view of showing the inner structure of the dry etching apparatus shown in FIG. 1.

FIG. 5 is a partially enlarged sectional view of the dry etching apparatus, marked in a circle V in FIG. 1. FIG. 6 is a perspective sectional view showing the dry etching apparatus, in which the baffle plate, a shield and pads are depicted. FIG. 7 is a perspective sectional view showing the dry etching apparatus shown in FIG. 1.

Referring to FIGS. 5, 6 and 7, the electrostatic chuck 104 is elevated at the position at which the dry etching process is performed. The outer peripheral surface 104a of the electrostatic chuck 104 faces the inner edge 112e of the baffle plate 112.

The step portion 102a is formed on the inner surface of the chamber 102 to mount the baffle plate 112 thereon. A plurality of screw holes 102b corresponding to the thru-holes of the baffle plate 112 are formed at the step portion 102a.

Plural pads 114 are disposed on the step portion 102a in order to adjust the mounting height of the baffle plate 112. The pads 114 have a flat ring shape, and the outer diameter of the pads 114 is equal to the outer diameter of the step portion 102a, and the inner diameter of the pads 114 is equal to the inner diameter of the step portion 102a.

The pads 114 are made of aluminum, and their surfaces are coated with material subjected to the anodizing treatment. A plurality of thru-holes are formed at positions corresponding to the thru-holes 112b of the baffle plate 112 in the pads 114, which, in one embodiment, have the same diameter as that of the thru-holes 112b of the baffle plate 112.

The pads 114 have a thickness of about 0.9~1.1 mm. According to the condition of the etching process, the number of the pads 114 can be adjusted to control the mounting height of the baffle plate 112.

The baffle plate 112 is disposed on the pads 114, and the shield 116 for protecting the inner surface of the chamber 102 against the plasma generated in the process region shown in FIG. 1 is disposed on the baffle plate 112.

The shield 116 has a cylindrical shape, of which an outer diameter is equal to the outer diameter of the baffle plate 112 and an inner diameter is equal to the inner diameter of the step portion formed on the inner surface of the chamber 102.

The shield 116 is made of aluminum, the surface of which is coated with material subjected to anodizing treatment. A plurality of thru-holes corresponding to the thru-holes 112*b* of the baffle plated 112 are formed in the shield 116. A step portion is formed in the respective thru-hole of the shield 116 so that a head of the screw may be inserted in the thru-hole of the shield 116.

The pads 114, the baffle plate 112 and the shield 116 are sequentially disposed on the step portion 102*a* formed on the inner surface of the chamber 102 so that the thru-holes in the pads 114, the baffle plate 112 and the shield 116 are aligned with the screw holes 102*b* of the step portion 102*a*. Screws 128 extend through the thru-holes of the shield 116, the baffle plate 112 and the pads 114 so as to be inserted into the screw holes 102*b* in the step portion 102*a* on the inner surface of the chamber 102, thereby fixing the pads 114, the baffle plate 112 and the shield 116 to the chamber 102.

The screws 128 are made of aluminum. Their heads are covered with a cap 130 made of Teflon material. The caps 130 protect the screws 128 against the plasma used in the etching process.

Figure 8:
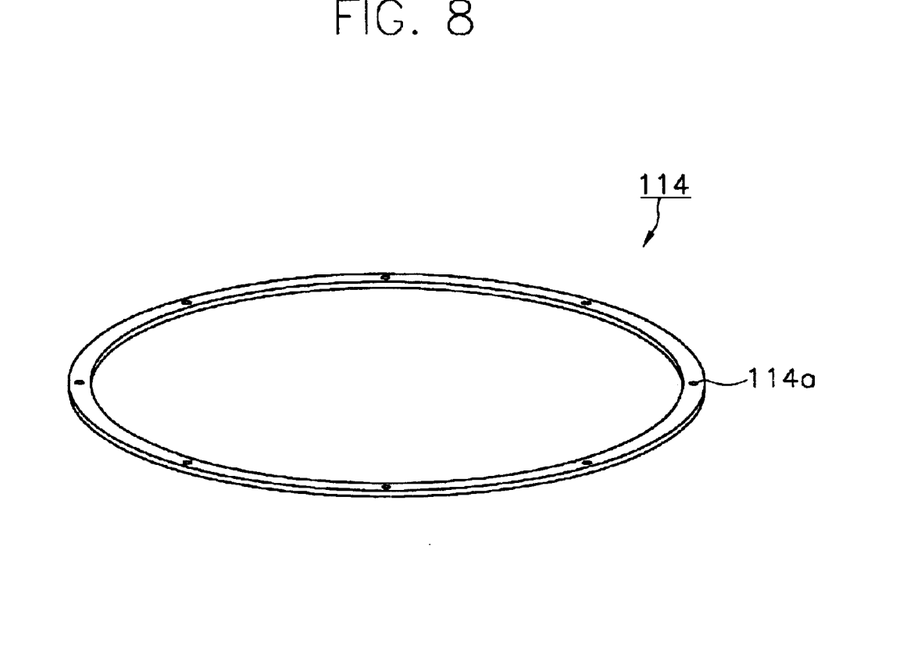
FIG. 8 is a perspective view showing a pad of the dry etching apparatus shown in FIG. 1.

FIG. 8 is a perspective view showing a pad of the dry etching apparatus shown in FIG. 1. Referring to FIG. 8, the pads 114 have a flat ring shape, and their surfaces are coated with the material subjected to the anodizing treatment. The plurality of thru-holes 114*a* are formed in the respective pad 114 in the circumference direction to be aligned with the screw holes 102*b* formed in the step portion 102*a* of the chamber 102 shown in FIG. 7. In one embodiment the holes 114*a* in the pads 114 have the same diameter as that of the thru-holes 112*b* of the baffle plate 112 as shown in FIG. 2.

The pads 114 have a thickness of 1 mm. Their outer diameter is equal to that of the baffle plate 112, and their inner diameter is equal to that the step portion 102*a*. The quantity of pads 114 used is adjusted to control the mounting height of the baffle plate 112 according to the condition of the etching process.

In one embodiment of the present invention, although the thickness of the pads 114 is about 1 mm, it is understood that the present invention should not be limited to this embodiment, and the pads can be made to be thinner in order to precisely control the mounting height of the baffle plate.

Figure 9:
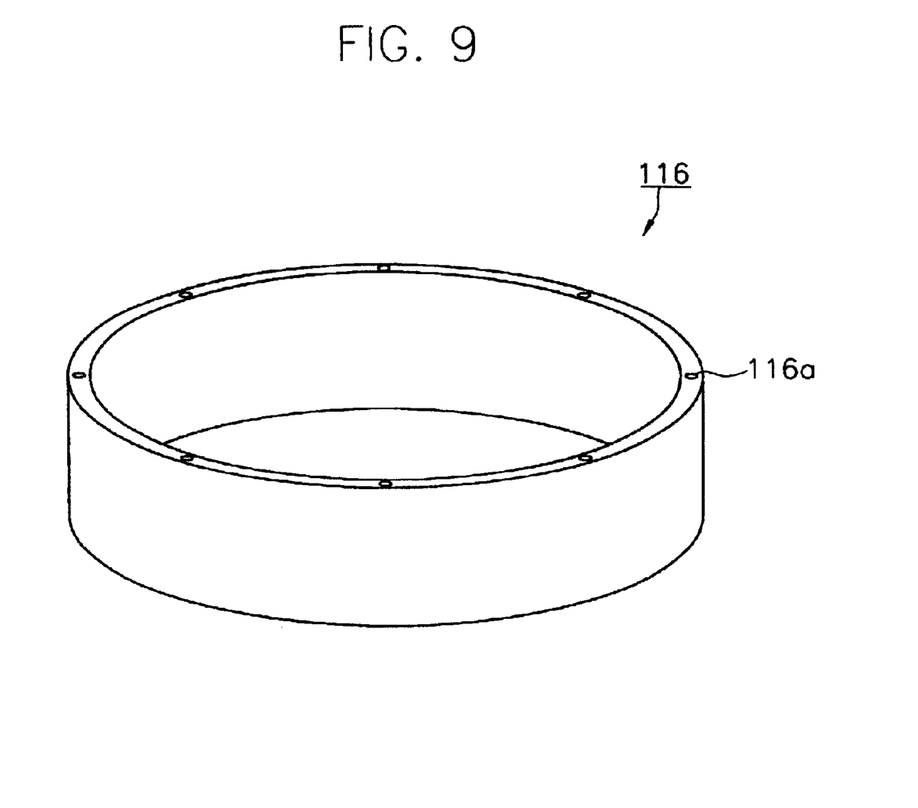
FIG. 9 is a perspective view showing a shield of the dry etching apparatus shown in FIG. 1.

FIG. 9 is a perspective view showing a shield of the dry etching apparatus shown in FIG. 1. Referring to FIG. 9, the shield 116 preferably has a cylindrical shape and is preferably made of aluminum, and its surface is coated with material subjected to the anodizing treatment. The plurality of thru-holes 116*a* corresponding to the screw holes 102*b* of the step portion 102*a* of the chamber 102 as shown in FIG. 7 are formed in the shield 116.

A step portion is formed in the respective thru-hole 116*a* of the shield 116 so that a head of the screw may be inserted in the thru-hole 116*a* of the shield 116. A diameter of a lower portion of the holes 116*a* in the shield 116 is equal to that of the thru-holes 112*b* of the baffle plate 112.

The height of the shield 116 can be varied according to the quantity of the pads 114 shown in FIG. 8. The shield 116 has the same outer diameter as that of the baffle plate 112 and the same inner diameter as that of the step portion 102*a* of the chamber 102.

Hereinafter, a process for removing the film formed on the semiconductor substrate by using the dry etching apparatus according to the embodiment of the present invention will be described.

Firstly, the semiconductor substrate is carried in the chamber performing the etching process, and is loaded on the electrostatic chuck.

Then, the electrostatic chuck is elevated to the position at which the peripheral surface of the chuck faces the inner edge of the baffle plate. At that time, the pressure in the chamber is maintained at a pressure of, in one embodiment, 35 mTorr by operation of the pump and the pressure control valve connected to the chamber.

Next, the etching gas, which can include $CHF_3$ and CO, is supplied from the etching gas supplying part connected to the upper electrode of the chamber into the chamber, and the radio frequency electric power is applied to the lower electrode mounted on the chuck to convert the etching gas into the plasma phase. At this time, the upper electrode acts as a grounded electrode, of which a temperature is maintained at 60 Celsius Degrees. The temperature of the electrostatic chuck is maintained at 20 Celsius Degrees and the temperature of the inner surface of the chamber is maintained at a temperature of 60 Celsius Degrees.

The plasma gas is reacted with the oxide film formed on the semiconductor substrate so as to etch the oxide film.

The reaction byproducts generated during the etching process and the non-reacted gas are discharged through the slits of the baffle plate by operation of the pump.

Figure 10:
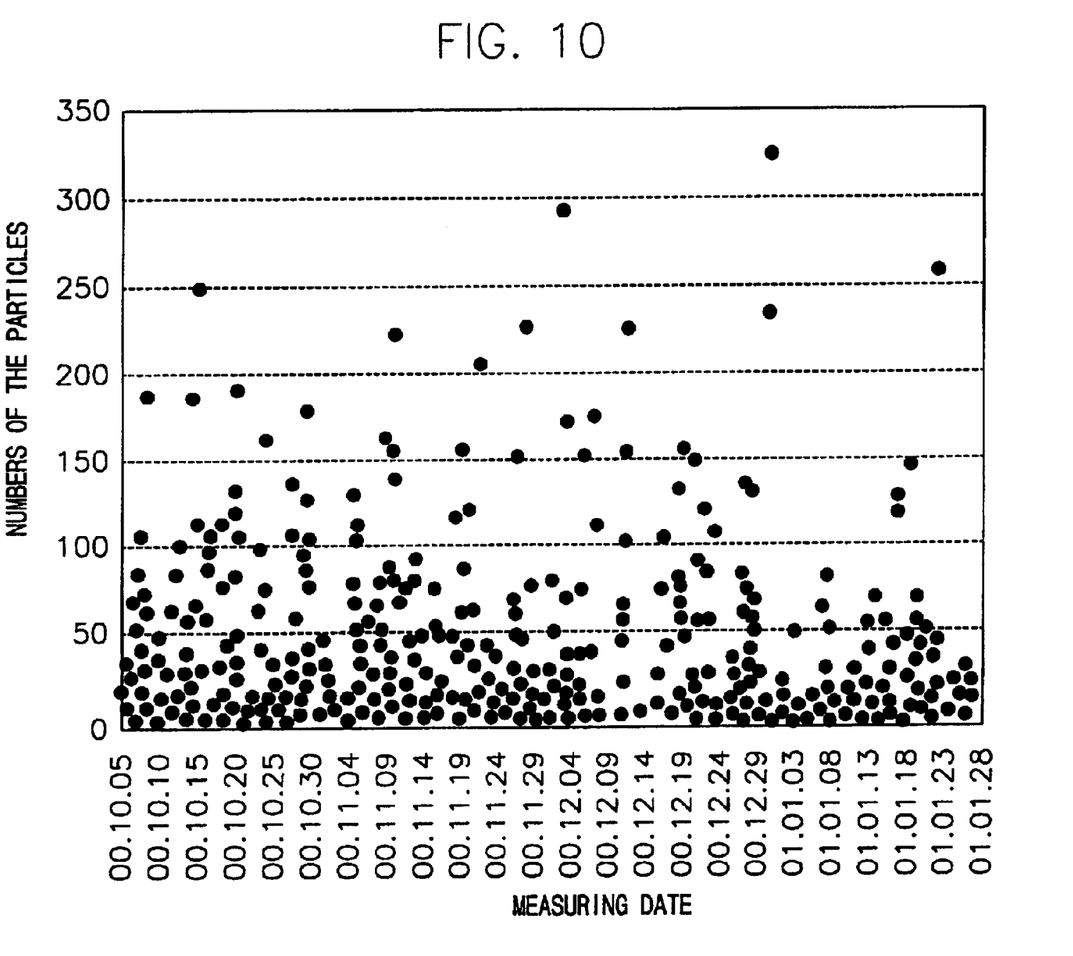
FIG. 10 is a graph showing an amount of pollution particles in a case that the baffle plate is mounted on an electrostatic chuck.
Figure 11:
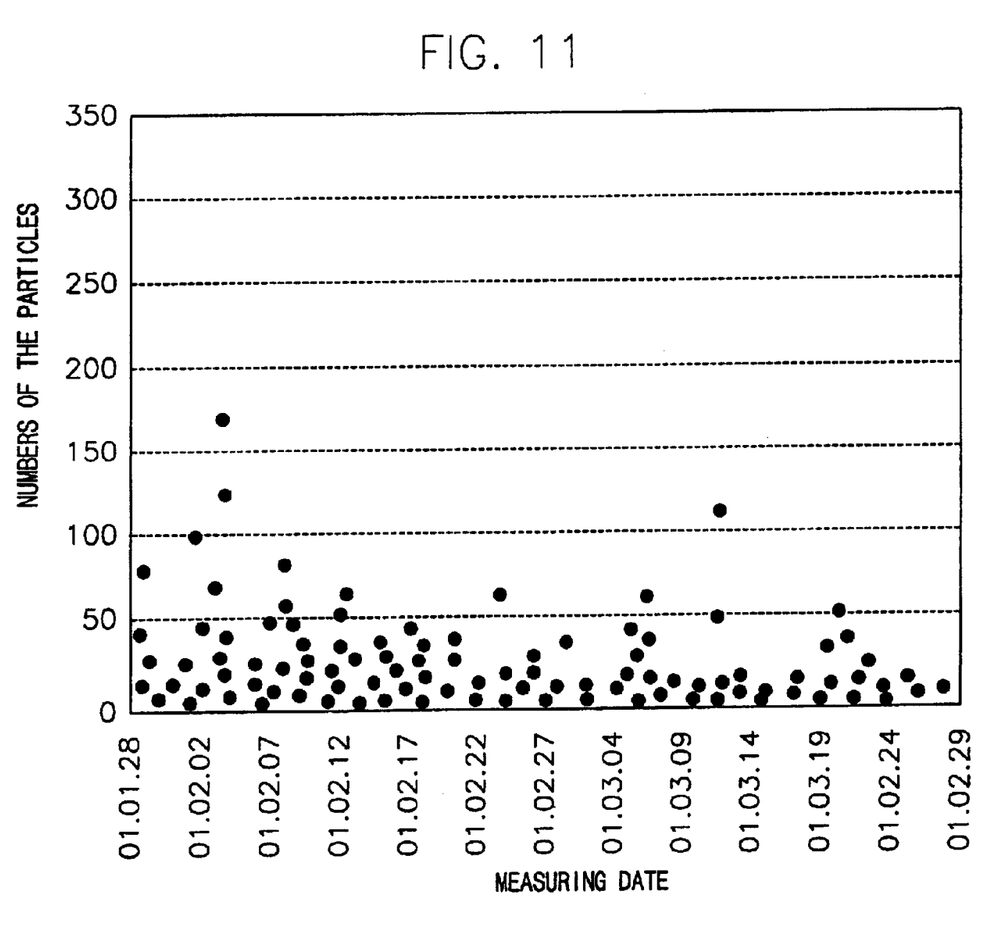
FIG. 11 is a graph showing an amount of pollution particles in a case that the baffle plate is mounted on an inner surface of the chamber.

FIG. 10 is a graph showing an amount of pollution particles in a case that the baffle plate is mounted on an electrostatic chuck, and FIG. 11 is a graph showing an amount of pollution particles in a case that the baffle plate is mounted on an inner surface of the chamber.

Referring to FIGS. 10 and 11, the graphs show the amount of pollution material generated according to the position of the baffle plate. FIG. 10 is the graph in the case that the baffle plate is mounted on the outer peripheral surface of the chuck to move upwardly and downwardly along with the chuck when the etching process is performed. FIG. 11 is the graph in the case that the baffle plate is mounted on the inner surface of the chamber in order not to move along with the chuck.

The graphs show the respective result after the film is etched under the same etching process condition. In the graph, the X axis indicates a measuring date and the Y axis shows the numbers of the particles acting as the pollution material. In comparison with the graphs, it can be noted that the amount of the pollution material is remarkably changed according to the position of the baffle plate.

According to the present invention as described above, in the dry etching apparatus using the plasma to etch the film formed on the semiconductor substrate, the amount of the pollution material can be reduced by mounting the baffle plate on the inner surface of the chamber performing the etching process. That is, as the baffle plate is fixed to the chamber, the generation of the pollution material due to the movement of the baffle plate can be prevented.

Accordingly, there are advantages in that the reliability and the productivity of the semiconductor device are improved and an operating ratio of the dry etching apparatus can be increased as times for the maintenance and repair are reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A dry etching apparatus comprising:
    a chamber into which a plasma gas for use in etching a film coated on a semiconductor substrate is provided in a plasma state;
    a chucking apparatus disposed in the chamber for supporting the semiconductor substrate, the chucking apparatus being upwardly elevated to a predetermined position to perform the dry etching process and moved downwardly to load and unload the semiconductor substrate; and
    a baffle plate for discharging from the chamber a reaction byproduct generated in the dry etching process and a non-reacted gas, the baffle plate having a flat ring shape and slits through which the reaction byproducts and the non-reacted gas are exhausted, the baffle plate being fixed to an inner surface of the chamber so that a terminal end of the baffle plate faces a peripheral surface of the chucking apparatus at the predetermined position.

2. A dry etching apparatus as claimed in claim 1, wherein a step portion is formed along the inner surface of the chamber, the baffle plate being placed on the step portion.

3. A dry etching apparatus as claimed in claim 2, further comprising at least one pad for adjusting a mounting height of the baffle plate, the pad being disposed between the step portion of the chamber and the baffle plate.

4. A dry etching apparatus as claimed in claim 3, wherein the pad has a flat ring shape.

5. A dry etching apparatus as claimed in claim 3, wherein the pad is made of aluminum, a surface of the pad being coated with a material subjected to an anodizing treatment.

6. A dry etching apparatus as claimed in claim 3, wherein the pad has a thickness of about 0.9 mm~1.1 mm.

7. A dry etching apparatus as claimed in claim 2, further comprising a shield for protecting the inner surface of the chamber against the plasma, the shield being disposed on the baffle plate to cover the inner surface of the chamber.

8. A dry etching apparatus as claimed in claim 7, wherein the shield is comprised of aluminum, a surface of the shield being coated with a material subjected to an anodizing treatment.

9. A dry etching apparatus as claimed in claim 1, wherein a plurality of thru-holes are formed along an outer edge of the baffle plate, a step portion on which the baffle plate is placed is formed along an inner surface of the chamber, and a plurality of screw-holes corresponding to the thru-holes of the baffle plate are formed along the inner surface of the chamber, such that screws extend through the thru-holes of the baffle plate to fix the baffle plate to the chamber.

10. A dry etching apparatus as claimed in claim 9, further comprising at least one pad for adjusting a mounting height of the baffle plate, the pad being disposed between the step portion of the chamber and the baffle plate and having a plurality of thru-holes corresponding to the thru-holes of the baffle plate so as to be attached to the chamber by the screws.

11. A dry etching apparatus as claimed in claim 9, further comprising a shield for protecting the inner surface of the chamber against the plasma, the shield being disposed on the baffle plate to cover the inner surface of the chamber and having a plurality of thru-holes corresponding to the thru-holes of the baffle plate so as to be attached to the chamber along with the baffle plate by the screws.

12. A dry etching apparatus as claimed in claim 1, further comprising a shield for protecting the inner surface of the chamber, the shield being mounted in the chamber to cover the inner surface of the chamber.

13. A dry etching apparatus as claimed in claim 1, wherein the chucking apparatus comprises:
    a chuck on which the semiconductor substrate is placed;
    a driving section which is disposed under the chuck for driving the chuck upwardly and downwardly; and
    a control section which is connected to the driving section for controlling an operation of the driving section as the dry etching process is carried out.

* * * * *